United States Patent [19]

Popovic et al.

[11] Patent Number: 4,829,352
[45] Date of Patent: May 9, 1989

[54] INTEGRABLE HALL ELEMENT

[75] Inventors: Radivoje Popovic, Zug; Axel Krause, Rotkreuz, both of Switzerland

[73] Assignee: LGZ Landis & Gyr Zug AG, Zug, Switzerland

[21] Appl. No.: 40,854

[22] Filed: Apr. 21, 1987

[30] Foreign Application Priority Data

Apr. 29, 1986 [CH] Switzerland ............... 01759/86

[51] Int. Cl.$^4$ .............. H01L 27/22; H01L 29/82; H01L 29/96; H01L 43/00
[52] U.S. Cl. .................... 357/27; 324/252; 338/32 H
[58] Field of Search ........... 324/251, 252; 357/27, 357/48, 45; 338/32 H; 307/278, 309

[56] References Cited

U.S. PATENT DOCUMENTS

| | | | |
|---|---|---|---|
| 3,823,354 | 7/1974 | Janssen | 357/27 |
| 4,141,026 | 2/1979 | Bate et al. | 307/309 |
| 4,253,107 | 2/1981 | MacDougall | 357/27 |
| 4,464,629 | 8/1984 | Tanaka et al. | 307/309 |
| 4,673,964 | 6/1987 | Popovic et al. | 357/27 |
| 4,677,455 | 6/1987 | Okajima | 357/36 |

FOREIGN PATENT DOCUMENTS

| | | | |
|---|---|---|---|
| 0148330 | 7/1985 | European Pat. Off. | |
| 0148330 | 7/1985 | European Pat. Off. | 357/27 |
| 57-48264 | 3/1982 | Japan | 357/27 |
| 58-155761 | 9/1983 | Japan | 357/27 |
| 58-154263 | 9/1983 | Japan | 357/27 |

OTHER PUBLICATIONS

I.E.E.E. Elect. Dev. Letters, vol. EDL-5, No. 9, Sep. 1984, pp. 357-358, "The Vertical Hall-Effect Device" by Popovic.

Primary Examiner—Andrew J. James
Assistant Examiner—Sara W. Crane
Attorney, Agent, or Firm—Marmorek, Guttman & Rubenstein

[57] ABSTRACT

An inventive Hall element formed from semiconductor material is disclosed. The inventive Hall element comprises a plurality of interconnected portions formed in a common semiconductor layer. Depending on how the portions are interconnected, the Hall element may detect the sum or difference of magnetic field values. The invention enables the realization of very large Hall elements which can be used in electrical meters to measure a magnetic field produced by an electric current.

6 Claims, 7 Drawing Sheets

INTEGRABLE HALL ELEMENT

FIELD OF THE INVENTION

The invention relates to an integrable Hall element, and particularly to a Hall element which minimizes non-linearities and has low 1/f noise.

BACKGROUND OF THE INVENTION

Hall elements are used advantageously in electrical meters or wattmeters to measure a magnetic field produced by an electric current. Such integrable Hall elements are known in the prior art such as EP 0 148 330 A2. The Hall element, disclosed in EP 0 148 330 A2 is called a vertical Hall element and it measures a magnetic field component which is parallel to the major surface of the Hall element. Another type of integrable Hall element is known from U.S. Pat. No. 4,253,107. This reference discloses a horizontal Hall Element which is used to measure a magnetic field component which is perpendicular to the major surface of the Hall element.

It is the objective of the instant invention to disclose Hall elements of any desired size, having relatively little nonlinearity and being characterized by relatively little 1/f noise, despite the presence of very thin semiconductor layers. For the invention, the effective length of a vertical Hall element is considerably greater than the thickness of the semiconductor layer.

SUMMARY OF THE INVENTION

The present invention is an integrable Hall element having two current terminals and two sensor terminals. The inventive Hall element comprises a plurality of portions. Each portion has two sets of contacts which may be used for interconnection with adjoining portions to form the inventive Hall element. More particularly, each portion is provided with two sets of contacts. The portions are connected so that current flows from a first current terminal sequentially through the portions to the second current terminal. Two contacts taken from a set of contacts unconnected with a current terminal form the sensor terminals. Illustratively, the contacts used to form the sensor terminals may be located adjacent a central section plane which divides the Hall element. Depending upon how adjoining portions ar interconnected, the resulting Hall element may be used to measure the sum or the difference of two magnetic fields.

Advantageously, in accordance with the present invention, it is possible to realize very large Hall elements, which can be used in electricity meters to measure magnetic fields produced by electric currents. The inventive Hall elements also have a high degree of linearity and little 1/f noise.

In a particular embodiment (vertical Hall element) each of the portions comprising the inventive Hall element is formed in a common semiconductor layer. The semiconductor layer is formed on a substrate. Illustratively the upper surface of each portion lies in the upper surface of the common semiconductor layer and the lower surface of each portion lies at the boundary between the semiconductor layer and the substrate. The upper and lower surfaces of each portion contain contacts which are used to establish connections with adjoining portions. More particularly, at least two points on the upper and lower surfaces of each interior portion are connected to an equipotential point on a surface of an adjoining portion. For each outer portion, at least two points on one of the surfaces is connected to a current terminal. As indicated above, depending on how adjoining portions are connected, the resulting Hall element may be used to measure the sum or difference of two spatially separate magnetic field values.

In an alternative embodiment of the invention (horizontal Hall element), instead of forming the portions so that there are contacts on the top and bottom surfaces of a semiconductor layer, the portions may be defined as planar regions with each planar region having two rows of contacts to permit electrical interconnection with adjoining portions.

BRIEF DESCRIPTION OF THE INVENTION

Identical reference numbers designate the same parts in all of the drawings.

DETAILED DESCRIPTION OF THE INVENTION

Figure 1:
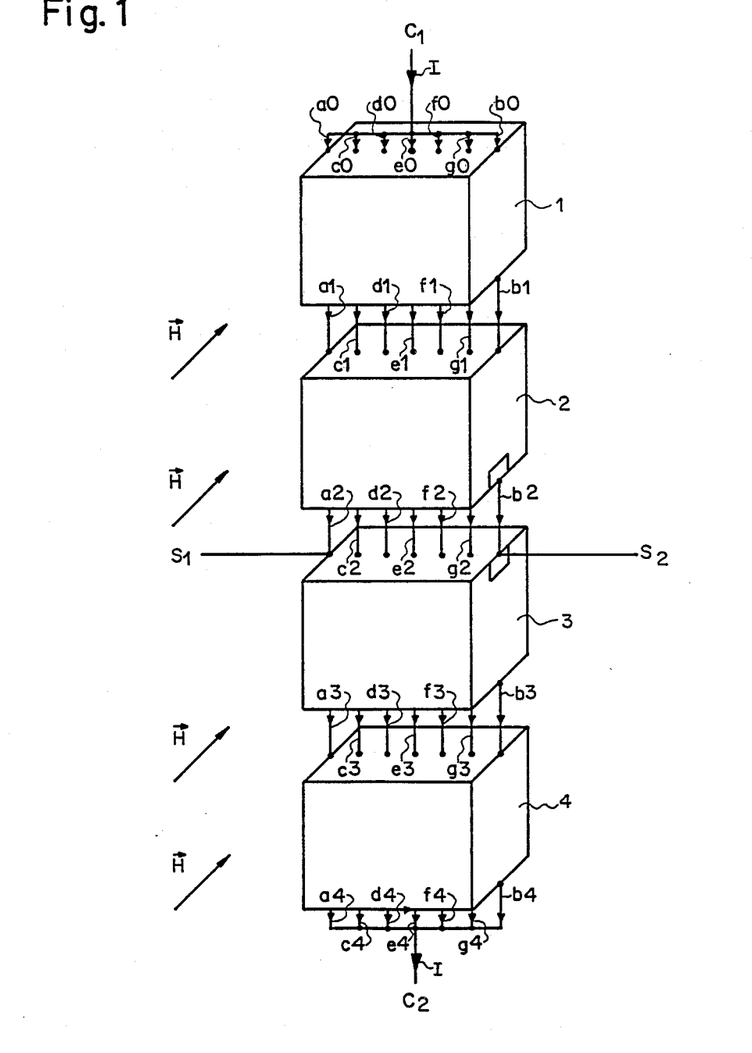
FIG. 1 is a schematic representation of a vertical Hall element, in accordance with an illustrative embodiment of the invention.

The subdivided Hall element shown in FIG. 1 starts with a right-angle parallelepiped of semiconductor material. As is explained below, the parallelpiped of semiconductor material is subdivided into a plurality of interconnected portions. The Hall element in FIG. 1 is provided with two current terminals $C_1$ and $C_2$ located on a first pair of oppositely disposed sides and two sensor terminals $S_1$ and $S_2$ located on a second pair of oppositely disposed sides so that the remaining two parallel sides are perpendicular to a magnetic field H shown. The Hall element is subdivided into a plurality of portions by at least one section plane so that the sensor terminals $S_1$ and $S_2$ are both connected to contacts in the same surface. The section surfaces need not be parallel to each other or be planar and also need not be perpendicular to the current flow in the Hall element. For reasons of simplification, it is assumed in FIG. 1 that all section surfaces are planar and perpendicular to the current flow, i.e., perpendicular to the connecting line between the current terminals $C_1$ and $C_2$.

Figure 2A:
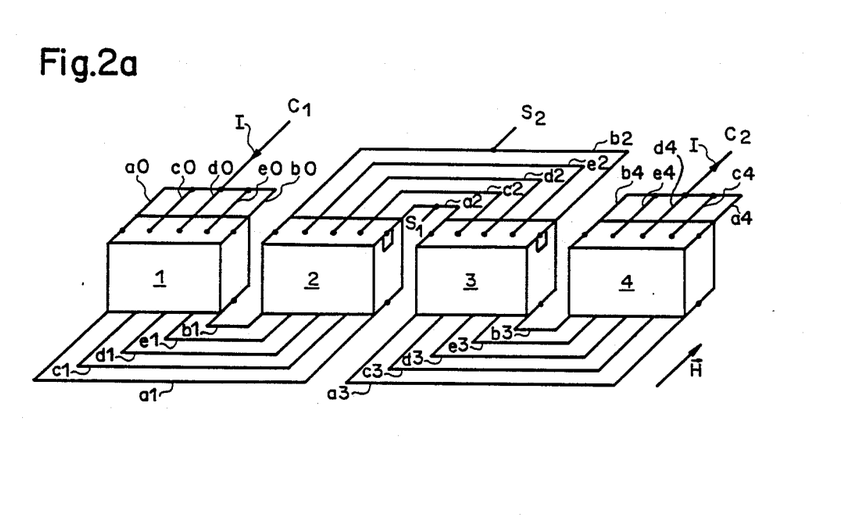
FIG. 2a is another schematic representation of a vertical Hall element in accordance with an illustrative embodiment of the invention.
Figure 2B:
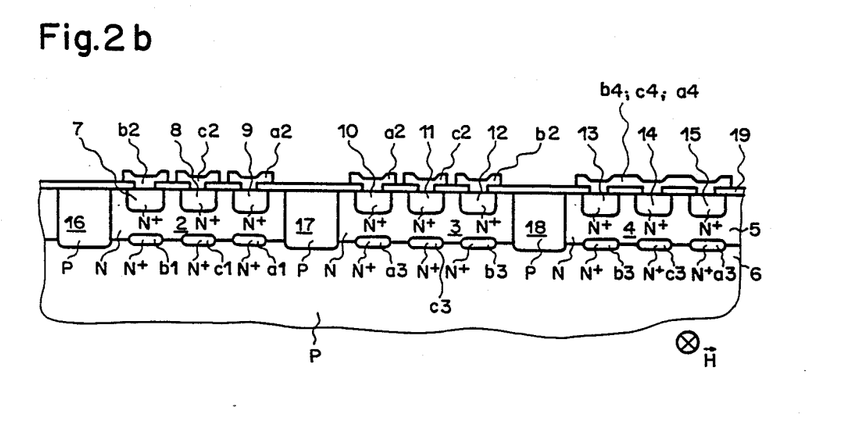
FIG. 2b is a schematic sectional view of an integrated vertical Hall element according to an illustrative embodiment of the invention.

It has seen assumed in FIGS. 1, 2a and 2b that there are three section planes producing four portions 1, 2, 3 and 4. In FIGS. 3 to 8 the assumption is made that there is only one section plane, producing portions 2 and 3. Corresponding points on each of the two sides of each section plane are connected to each other by electrically conductive wires which may be thought of as elastic for purposes of simplifying the explanation herein. Theoretically, there are an infinite number of points and possible wires. In FIG. 1 and in each of the FIGS. 3 to 5 the presence of seven connections a to g per section plane has been assumed. It is assumed that in FIG. 2a, there are five connections a to e per section plane. In FIG. 2b, there are three connections a to c per section plane assumed and in each of FIGS. 6 to 8, there are four connections a to d per section plane assumed. In any case, at least two such connections a and b must be present for each section plane and these connections extend between equipotential points. With respect to the central section plane (i.e., the section plane between portions 2 and 3) the two connections crossing this plane are made between points having the same potential as the sensor terminals $S_1$ and $S_2$.

In this manner, at least two of several points of every upper and of every lower surface of each of the portions 1 to 4 are connected to an equipotential point of the oppositely disposed surface of a neighboring portion.

When spatial separation of the four portions 1 to 4 is caused by parallel displacement, the connections assumed to be elastic become longer; however, the Hall element shown in FIG. 1, due to the connections and despite the spatial separation of the portions 1 to 4 continues to function exactly as if no separation existed because the connections connect equipotential points to each other. In FIG. 1 the eight connections a1 to g1 are between the portions 1 and 2, the eight connections a2 to g2 are between the portions 2 and 3 and the eight connections a3 to g3 are between the portions 3 and 4.

The points of the outer surfaces of the two outer portions 1 and 4 which are selected as equipotential points are each electrically connected to each other and to the current terminal $C_1$ or $C_2$ associated with that surface. That is, all of the eight connections a0 to g0 on the upper surface of the upper portion 1 shown in the FIG. 1 are connected to the first current terminal $C_1$ and all the connections a4 to g4 on the lower surface of the lower portion 4 are connected to the second current terminal $C_2$.

A supply current I in FIG. 1 flows via the first terminal $C_1$ and the parallel connections a0 to g0 into the portion 1 and thereby into the Hall element. The supply current I continues to flow in the indicated sequence through the portion 1, via the parallel connections a1 to g1, through the portion 2, via the parallel connections a2 to g2, through the portion 3, via the parallel connections a3 to g3, through the portion 4 and via the parallel connections a4 to g4 to the second terminal $C_2$ and thereby out of the Hall element. The Hall voltage produced in the Hall element through this supply current I and the magnetic field H appears between the two sensor connections $S_1$ and $S_2$. It may be pointed out that none of the portions 1 to 4 of FIG. 1, taken by itself, constitutes a complete Hall element.

Figure 3:
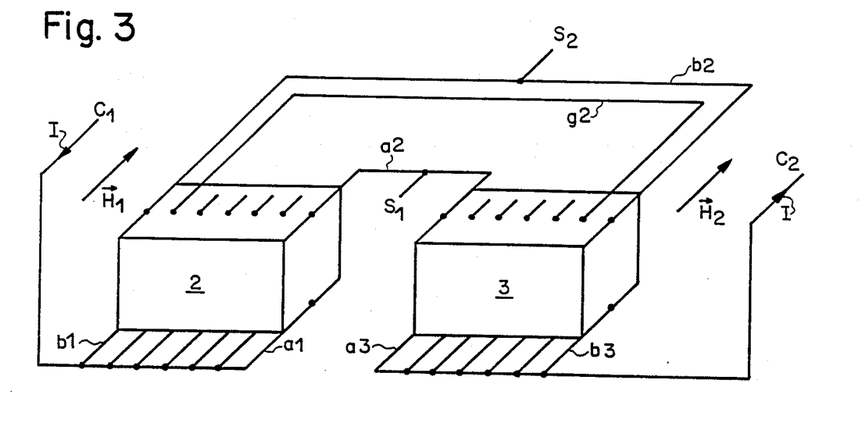
FIG. 3 is a schematic representation of a vertical Hall element subdivided into two portions and arranged to add magnetic field values.
Figure 5:
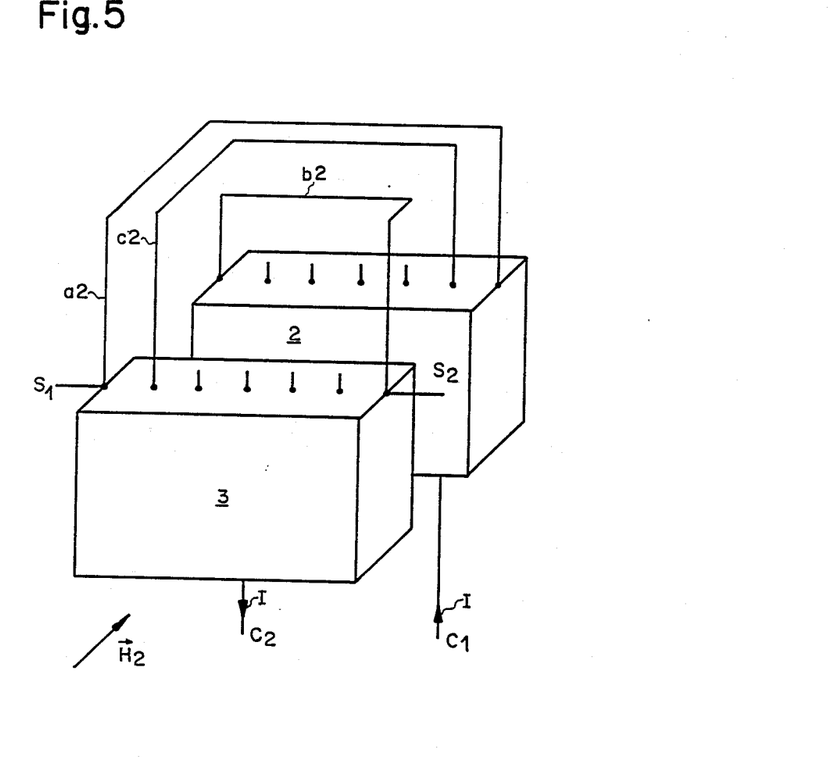
FIG. 5 is another schematic representation of a conventional vertical Hall element subdivided into two portions and arranged to add magnetic field values according to an illustrative embodiment of the invention.

The portions 1 to 4 can be located at any desired distance from each other and can even be twisted in relation to each other, on condition that the vectorial directions of the magnetic field H, the current density in the Hall element, and the Hall electric field in the Hall element continue to maintain their relative orientations such as shown in FIGS. 2a, 3 and 5.

The portions 1 to 4 are located nearly in a straight line next to each other in FIG. 2a. The portions 1 to 4 are lined up next to each other so that the upper surfaces of all of the portions lie in the same plane. In order to transform from the arrangement of FIG. 1 to the arrangement of FIG. 2a, portions 2 and 4 are turned upside down while portions 1 and 3 are not turned upside down. In any event, the arrangements of FIG. 1 and FIG. 2a are generally electronically equivalent. All connections between the portions 1 to 4 are shown parallel to each other. The relative orientations of the three mentioned vectorial directions have remained unchanged from their original orientations. shown in FIG. 1. All of the connections a0 to e0, a2 to e2 and a4 to e4 are located on top of the portions 1 to 4, and all of the connections a1 to e1 and a3 to e3 are located on the bottom of the portions 1 to 4.

The integrated vertical Hall element shown schematically in FIG. 2b is a practical realization of the schematic arrangement shown in FIG. 2a. The common plane in which the upper surfaces of the portions 1 to 4 lie is the surface plane of a common semiconductor layer 5 in which all of the portions 1 to 4 are located. The semiconductor layer 5 is, for example, a thin epitaxial layer which has been grown on a substrate 6. For the sake of simplification, only the three portions 2 to 4 are shown in FIG. 2b. Each of the connections a1 to c1 and a3 to c3, comprises a buried layer which is located at the boundary between substrate 6 and semiconductor 5. Each of portions 1 and 2 includes buried layers forming the connections a1 to c1 which are shown only for the portion 2 in FIG. 2b. Each of portions 3 and 4 has its buried layers which form the connections a3 to c3.

In FIG. 2b, a contact diffusion is located facing each of the buried layers at the surface of the semiconductor layer 5. These contact diffusions are designated 7 to 9 for the portion 2, 10 to 12 for the portion 3, and 13 to 15 for the portion 4. The connections a0 to c0, are not shown in FIG. 2b because portion 1 is not shown. The connections a2 to c2 and a4 to c4 are each provided with an electrical contact with one of the contact diffusions. These connections taken together constitute the so-called metallization of the integrated circuit and are applied on the surface of the semiconductor layer 5. The metallization layer typically includes a metal, e.g. aluminum, or an electrically conductive polysilicon. For the purpose of electrical insulation, an insulation layer 19, which can be made of $SiO_2$ is located between the metallization layers and the semiconductor layer 5. The metallization layer is located directly on the insulation layer 19 which in turn lies directly on the semiconductor layer 5. The connections a4 to c4 of the portion 4 are connected to each other to obtain a connection with the common current terminal $C_2$. To obtain insulation from neighboring portions and to obtain an island effect, each of the portions 1 to 4 can be surrounded laterally by a rectangular insulation ring so that two adjoining insulation rings have a common connection region 16, 17 or 18. The insulation ring with connection regions 16;17 surrounds portion 2 and the insulation ring with connection regions 17;18 surrounds the portion 3. The insulation rings extend deep down from the surface of the semiconductor layer 5, e.g., up to physical contact with the substrate 6.

The substrate 6, the insulation rings and their connection regions 16, 17 and 18 are all made of a semiconductor material of the same conductivity type, e.g., conductivity type P. Conductivity type N could also be used. The semiconductor layer 5, the buried layers and the contact diffusions 7 to 15 are all made of a semiconductor of the opposite conductivity type, such as conductivity type N. The buried layers and the contact diffusions 7 to 15 are all heavily doped with impurity atoms, i.e., they comprise N+ material.

The Hall element arrangement shown in FIG. 3 is similar to the Hall element shown in FIG. 2a, but only portions 2 and 3 are left. Because of this, the connections to the two current terminals $C_1$ and $C_2$ are located on the lower surface of the portions 2 and 3 and not, as in FIG. 2a, on the upper surfaces of the portions 1 and 4.

Figure 4:
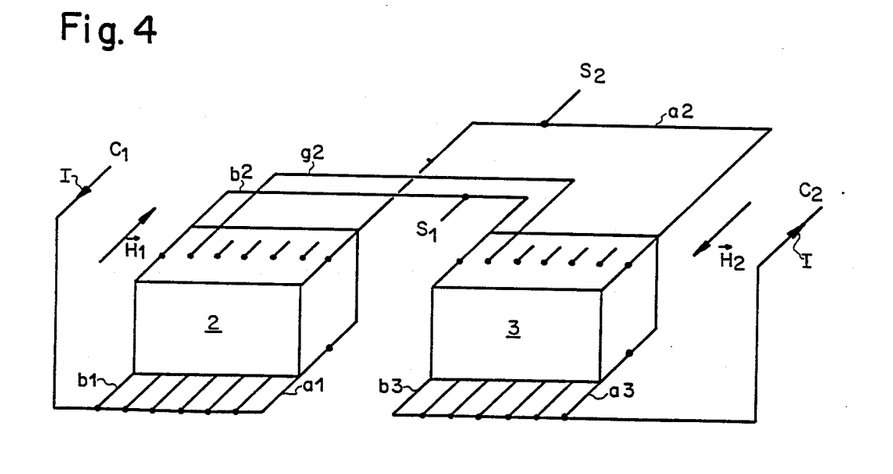
FIG. 4 is a schematic representation of a vertical Hall element subdivided into two portions and arranged to subtract magnetic field values according to an illustrative embodiment of the invention.

The Hall element shown in FIG. 4 is similar to the Hall element shown in FIG. 3, with the exception that the connections on the surfaces of portions 2 and 3 are n longer parallel to each other, but cross each other. Because of this, the relative orientations of the three above-mentioned vectorial directions no longer match the original positions. The magnetic field component measured has shifted its relative orientation at the location of portion 3 by 180°. This means that the Hall element shown in FIG. 4 no longer measures the sum $H_1+H_2$, as in the Hall element shown in FIG. 3, but the difference $H_1-H_2$ of two magnetic fields $H_1$ and $H_2$, where $H_1$ is the magnetic field at the location of portion 2, and $H_2$ is the magnetic field at the location of portion 3. In other words: the Hall element shown in FIG. 4 can be used to measure a magnetic field gradient between two spatially separated points.

The Hall element shown schematically in FIG. 5 is similar to that shown in FIG. 3, with the difference that the two portions 2 and 3 are not substantially aligned in a row next to each other, but are substantially aligned in a row behind each other. However, the connections which are uppermost in FIG. 3 run crosswise in FIG. 5 in order to leave the relative orientations of the three vectorial directions unchanged.

Figure 6:
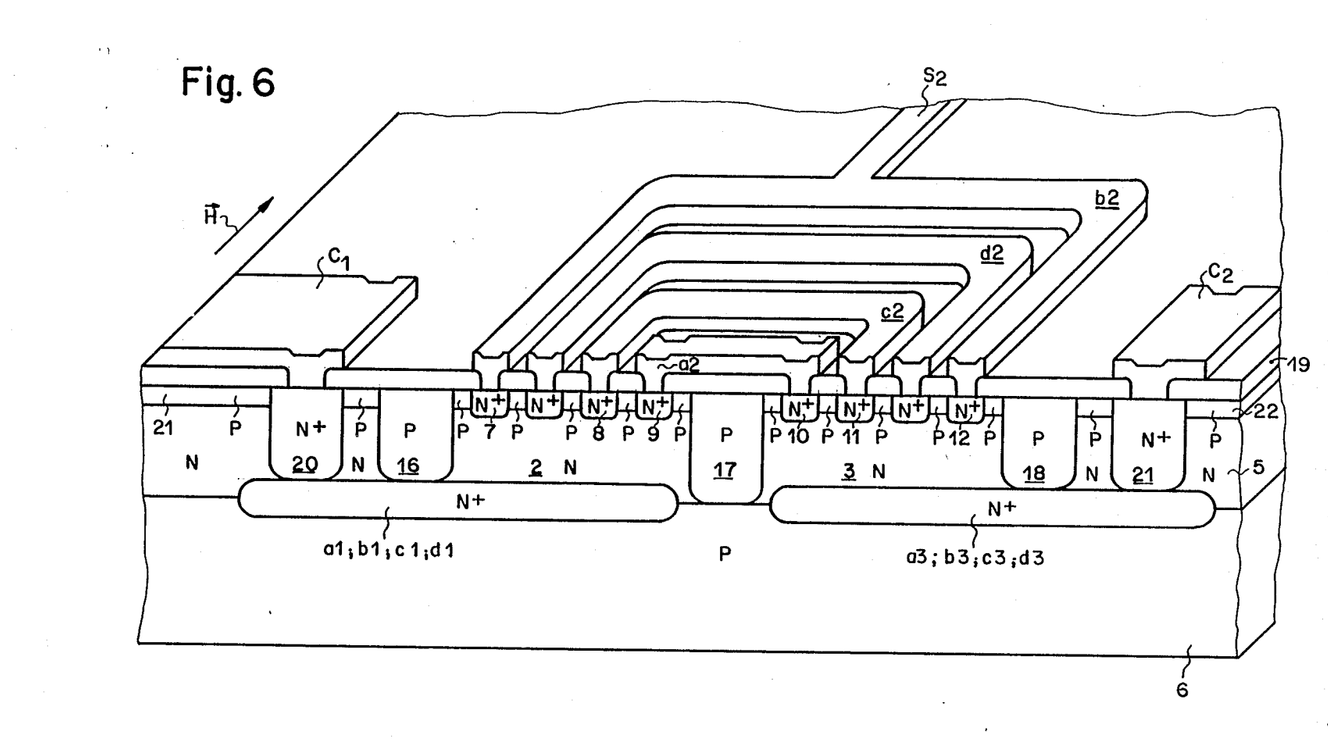
FIG. 6 is a schematic fragmentary perspective view of a sectional portion of another subdivided integrated vertical Hall element according to an illustrative embodiment of the invention.

FIG. 6 shows the practical realization of the Hall element shown in schematic representation in FIG. 3, whereby a vertical Hall element is again produced. The Hall element shown is nearly identical to the integrated vertical Hall element shown in FIG. 2b, with the difference that this time only two portions 2 and 3 are present.

The points to be connected to the current terminal $C_1$ or $C_2$ shown in FIG. 3 on the lower sides of the portions 2 and 3), constitute one single common buried layer a1; b1; c1; d1 or a3; b3; c3; d3 per portion 2 or 3 in FIG. 6 with each connected with one current terminal $C_1$ or $C_2$ of the Hall element via a deep diffusion region 20 or 21 extending fully through the semiconductor layer 5 to the surface of the Hall element. This surface is common to the integrated circuit. The deep diffusion regions 20 and 21 are made of a material of the same conductivity type as the common buried layers and are heavily doped with impurity atoms as are the common buried layers. For example, the deep diffusion regions 20, 21 and common buried layers are formed from N+ material.

The integrated vertical Hall elements according to FIGS. 2b and 5 have the advantage that, in contrast to prior art vertical Hall elements, the two current terminals $C_1$ and $C_2$ are constructed differently and have very different dimensions, and possess symmetric properties in both current directions.

To ensure long-time stability, the surface of the semiconductor layer 5 in FIG. 6 is coated with a thin surface layer 22 which is made of the same material as the substrate 6. For example, the layer 22 and the substrate 6 are formed from P-type material. All contact diffusions 7 to 12, all connection regions 16 to 18 and the two deep diffusion regions 20 and 21 fully traverse the thin surface layer 22. The vertical Hall element shown in FIG. 2b can also be provided advantageously with a thin surface layer 22, but this is not shown in FIG. 2b.

Figure 7:
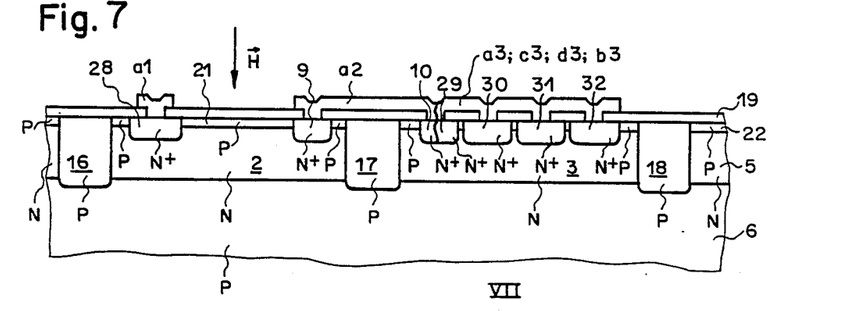
FIG. 7 is a sectional view along the line VII—VII in FIG. 8.
Figure 8:
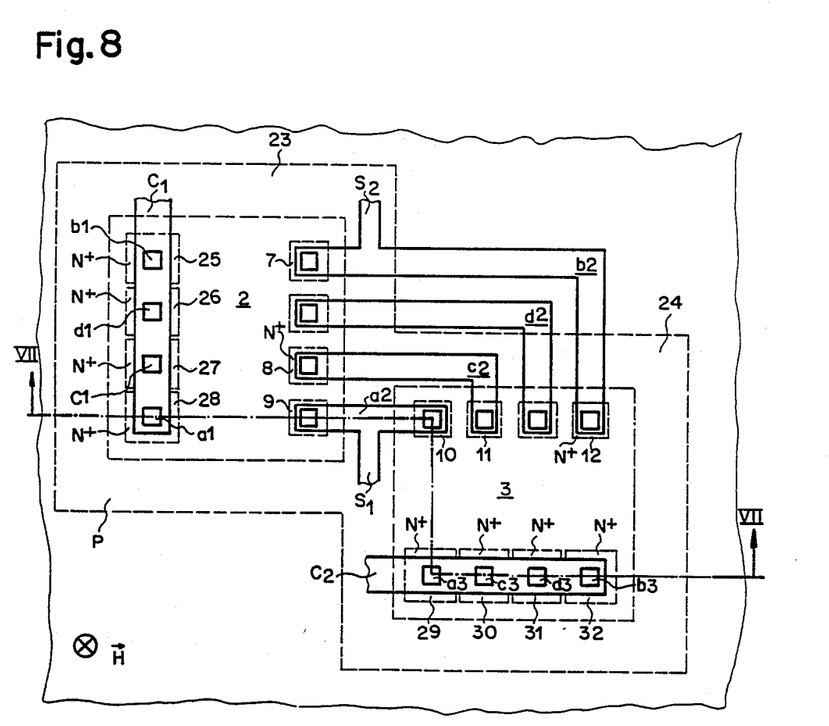
FIG. 8 is a schematic plan view of an integrated horizontal Hall element subdivided into two portions according to an illustrative embodiment of the invention.

The two FIGS. 7 and 8 show, respectively, a sectional view along line VII—VII and a plan view of one and the same horizontal Hall elements The Hall element includes two portions 2 and 3, but these are not aligned in a row next to each other. The portions 2 and 3 are located in the semiconductor layer 5. As seen from above, the portions 2 and 3 are turned relative to each other by an angle of about ninety degrees. The spatial position and the material of substrate 6, of the semiconductor layer 5, of the surface layer 22, of the insulation layer 19, of the metallization layer and of the connection regions 16, 17 and 18 of the insulation rings which are designated 23 and 24 in FIG. 8, are the same as in FIG. 6. All connections a1 to d1, a2 to d2 and a3 to d3 are located in the form of metallizations at the upper surface of the Hall element. Thus, there are no buried layers in this case. These have been replaced by contact diffusions 25 to 32, so that the contact diffusions 25 to 28 on the one hand, and the contact diffusions 29 to 32 on the other hand, are substantially lined up in rows, respectively. The contact diffusions 25 to 32 are all made of material of the same conductivity type as the contact diffusions 7 to 12, i.e., N+-type material. The rows of contact diffusions 25; 26; 27; 28 and 29; 30; 31; 32 form nearly an angle of about 90° to each other. Each of the portions 2 and 3 is provided with oppositely disposed two contact diffusions rows 25; 26; 27; 28 and 7; 8; 9 or 10; 11; 12 and 29; 30; 31; 32. In each of the two contact diffusion rows 7; 8; 9 and 10; 11; 12, a contact diffusion without number is drawn in FIG. 8, facing the contact diffusion 26 or 31. Each of the contact diffusions 7 to 9 on the one hand, and 10 to 12. on the other hand, are also arranged in a straight row that is preferably parallel to the contact diffusion row 25; 26; 27; 28 or 29; 30; 31; 32.

The connections a2 to d2 in FIGS. 7 and 8 connect the contact diffusions 7 to 9 electrically to the contact diffusions 10 to 12, with each of the connections a2 and d2 being provided with a sensor connection $S_1$ or $S_2$ respectively. The first current terminal $C_1$ of the Hall element is connected via connections a1 to d1 to the contact diffusions 25 to 28, all four of which belong to portion 2. The second terminal $C_2$ of the Hall element is connected via connections a3 to d3 to the contact diffusions 29 to 32, all four of which are associated with portion 3.

The horizontal Hall element shown in FIGS. 7 and 8 has the advantage that its null voltage (offset voltage) is compensated extensively, as will be explained in further detail in connection with FIGS. 9a and 9b.

Figure 9A:
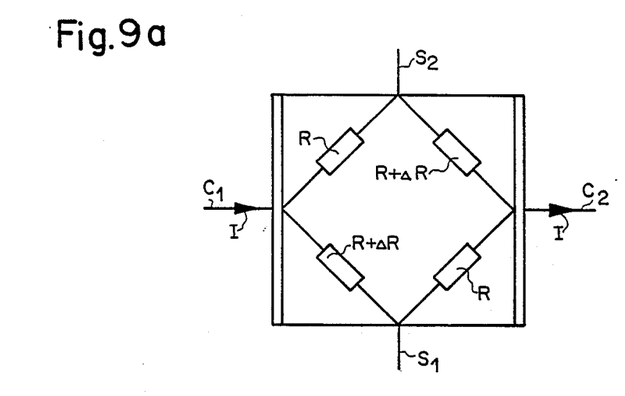
FIG. 9a shows an equivalent electrical circuit of an inventive Hall element.

FIG. 9a shows a bridge circuit made up of four resistors and represents the equivalent circuit diagram of a conventional Hall element. The bridge circuit contains two different resistance values R and R+ΔR. The bridge circuit comprises two pairs of oppositely disposed and parallel resistors. One pair contains two resistors of resistance R. The other pair contains two resistances of resistance R+ΔR. The resistance difference ΔR is created by piezoresistive effects, geometric tolerances, etc. In a magnetic field H=0, a null voltage $V_{off}=(\Delta R/R)V_{C1,C2}$ occurs between the sensor outputs $S_1$; $S_2$ of the Hall, element whereby $V_{C1,C2}$ represents a voltage existing between the current terminals $C_1$, $C_2$ of the Hall element.

Figure 9B:
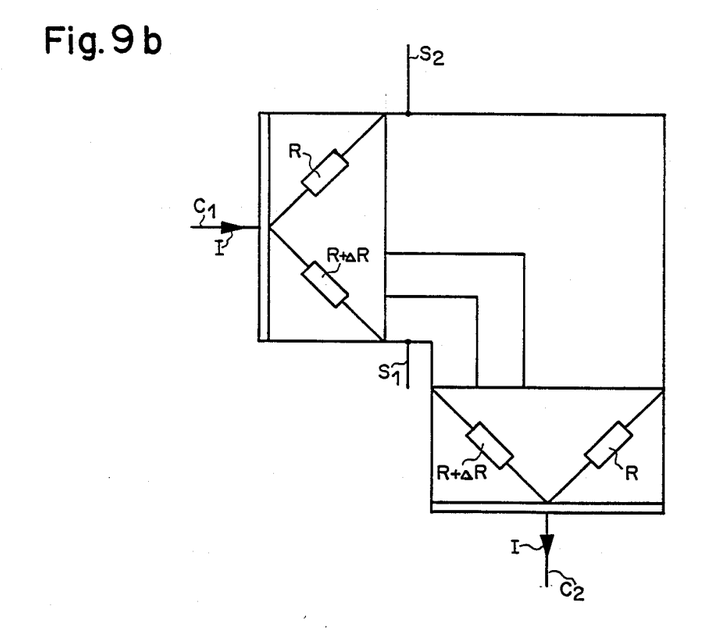
FIG. 9b is an equivalent electrical circuit of the horizontal Hall element shown in FIGS. 7 and 8.

The equivalent circuit diagram of the horizontal Hall element shown in FIGS. 7 to 8 is reproduced in FIG. 9b. It differentiates itself from the equivalent circuit diagram shown in FIG. 9a in that one half of the bridge circuit is turned away by a 90° angle from the other half. In FIG. 9b, there are two parallel oriented resistances of value R and two parallel resistances of value R+ΔR. The two resistances of value R+ΔR are aligned in a row in this case, as seen in the direction of flow of the supply current I, which leads to $V_{off}$ becoming equal to zero.

Nullification of the null voltage $V_{off}$ can be achieved in a vertical Hall element (see FIG. 3) by replacing the short circuit connections a2 and b2 with two rows of switched resistances (not shown) with their joint pole being connected to one of the sensor connections $S_1$ or $S_2$. These resistances should be adjustable balancing resistances. Such resistances should preferably comprise, for example, a junction field effect transistor (JFET) or an MOS field effect transistor, the source-drain channel resistance of which represents a resistance value that can be adjusted by means of the gate voltage of the field effect transistor.

All of the integrated Hall elements described herein can be made according to conventional bipolar integrated circuit technology The utilization of Hall elements which are subdivided several times in accordance with the invention enables Hall elements of any desired size to be realized even though a thin epitaxial layer in the form of semiconductor layer 5 is present. This has the advantage that the non-linearities of the Hall element are minimized and its 1/f noise is relatively low.

Finally, the above described embodiments of the invention are intended to be illustrative only. Numerous alternative embodiments may be devised by those skilled in the art without departing from the spirit and scope of the following claims.

We claim:
1. A Hall element comprising
 a body of semiconductor material divided into at least first and second regions,
 a first row of electrical contacts formed on a surface of said first region,
 a second row of electrical contacts formed on a surface of said second region,
 a plurality of connecting means for connecting each contact of said first row to a corresponding contact of said second row, corresponding contacts in said first and second row being equipotential,
 first and second current contacts formed in contact with said semiconductor body for applying a current to said semiconductor body, said current flowing through said first region, through said connecting means, and through said second region, and
 first and second sensor terminals, said first and second sensor terminals each being connected to an outer one of said connecting means.

2. The Hall element of claim 1 wherein;
 said semiconductor body is an epitaxial layer of a first conductivity type formed on a semiconductor substrate of an opposite conductivity type, each of said first and second regions being formed in said epitaxial layer and being surrounded by an insulating ring, said first and second rows of contacts being formed on an upper surface of said epitaxial layer.

3. The Hall element of claim 2 wherein said current flows to said first region via a first buried layer formed at the interface of said epitaxial layer and said substrate and wherein said current flows from said second region via a second buried layer formed at the interface of said epitaxial layer and said substrate.

4. The Hall element of claim 2 wherein said epitaxial layer includes a third region formed adjacent the first region and a fourth region formed adjacent the second region, said first current contact being formed on an upper surface of said third region and said second current contacting formed on an upper surface of said fourth region, said current flowing between said first and third regions and between said second and fourth regions via one or more buried layers formed at the interface between said substrate and said epitaxial layer and via said substrate.

5. The Hall element of claim 1 wherein said first and second rows of contacts are oriented at ninety degrees relative to one another.

6. The Hall element of claim 2 wherein said epitaxial layer is covered by a surface layer having a conductivity type opposite to that of said epitaxial layer.

* * * * *